(12) United States Patent
Ali et al.

(10) Patent No.: US 11,942,359 B2
(45) Date of Patent: Mar. 26, 2024

(54) REDUCED SEMICONDUCTOR WAFER BOW AND WARPAGE

(71) Applicant: Texas Instruments Incorporated, Dallas, TX (US)

(72) Inventors: Abbas Ali, Plano, TX (US); Christopher Scott Whitesell, Garland, TX (US); Brian K. Kirkpatrick, Allen, TX (US); Byron Joseph Palla, Murphy, TX (US)

(73) Assignee: TEXAS INSTRUMENTS INCORPORATED, P.O. Box 655474, M/S 3999 Dallas, TX (US)

( * ) Notice: Subject to any disclaimer, the term of this patent is extended or adjusted under 35 U.S.C. 154(b) by 0 days.

(21) Appl. No.: 17/538,372

(22) Filed: Nov. 30, 2021

(65) Prior Publication Data

US 2023/0170248 A1 Jun. 1, 2023

(51) Int. Cl.
*H01L 21/762* (2006.01)
*H01L 27/02* (2006.01)
*H01L 29/06* (2006.01)

(52) U.S. Cl.
CPC .............. *H01L 21/76224* (2013.01); *H01L 21/76202* (2013.01); *H01L 27/0203* (2013.01); *H01L 29/0649* (2013.01)

(58) Field of Classification Search
CPC ......... H01L 21/76224; H01L 21/76202; H01L 27/0203; H01L 29/0649; H01L 21/0217; H01L 21/31144
USPC ............................................. 257/510; 438/296
See application file for complete search history.

(56) References Cited

U.S. PATENT DOCUMENTS

| 9,825,030 B2 | 11/2017 | Xiong et al. | |
| 10,811,543 B2 | 10/2020 | Hu et al. | |
| 2022/0102289 A1* | 3/2022 | Kim et al. | H01L 23/562 |
| 2023/0032481 A1* | 2/2023 | Huang et al. | H01L 22/20 |

OTHER PUBLICATIONS

U.S. Appl. No. 17/514,786, entitled "Integrated Circuit Device With Improved Oxide Edging", filed Oct. 29, 2021.

* cited by examiner

*Primary Examiner* — Thinh T Nguyen
(74) *Attorney, Agent, or Firm* — Yudong Kim; Frank D. Cimino

(57) ABSTRACT

Forming an integrated circuit, for example by first, concurrently forming a first front end of line (FEOL) layer having a first thickness and a surface contacting or facing a semiconductor substrate frontside and a second FEOL layer, having a second thickness and including a same material as the first FEOL layer and having a surface contacting or facing a semiconductor substrate backside, and second, processing the second FEOL layer to reduce the second thickness.

17 Claims, 7 Drawing Sheets

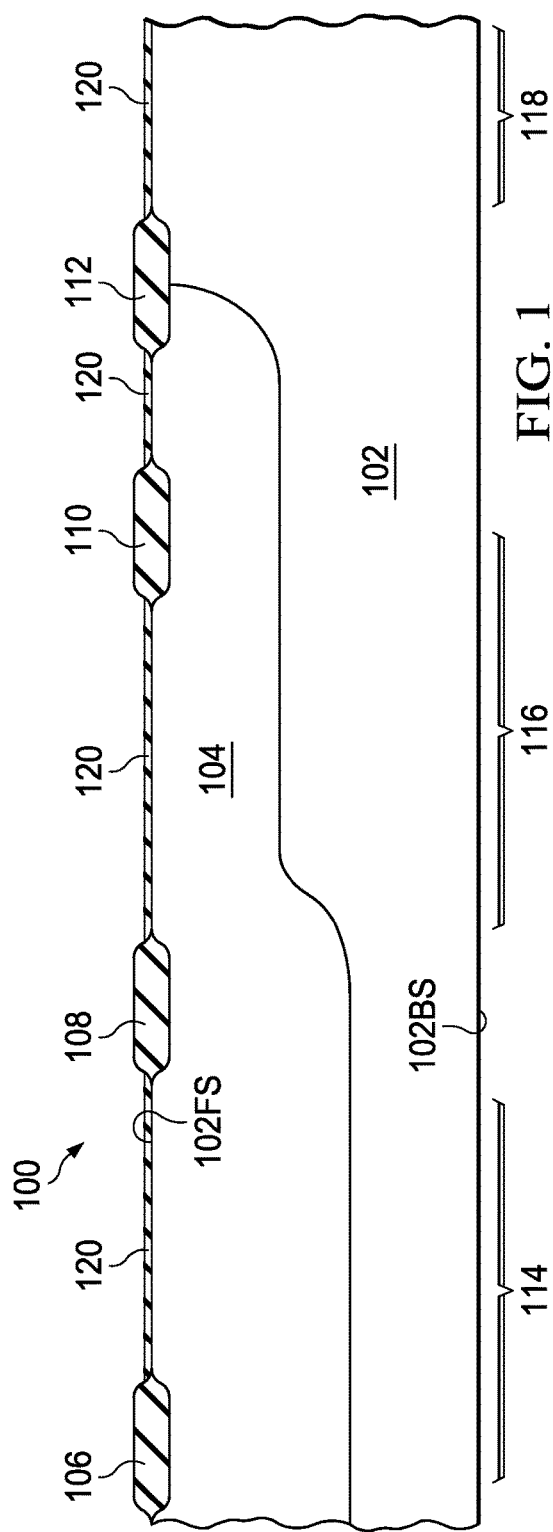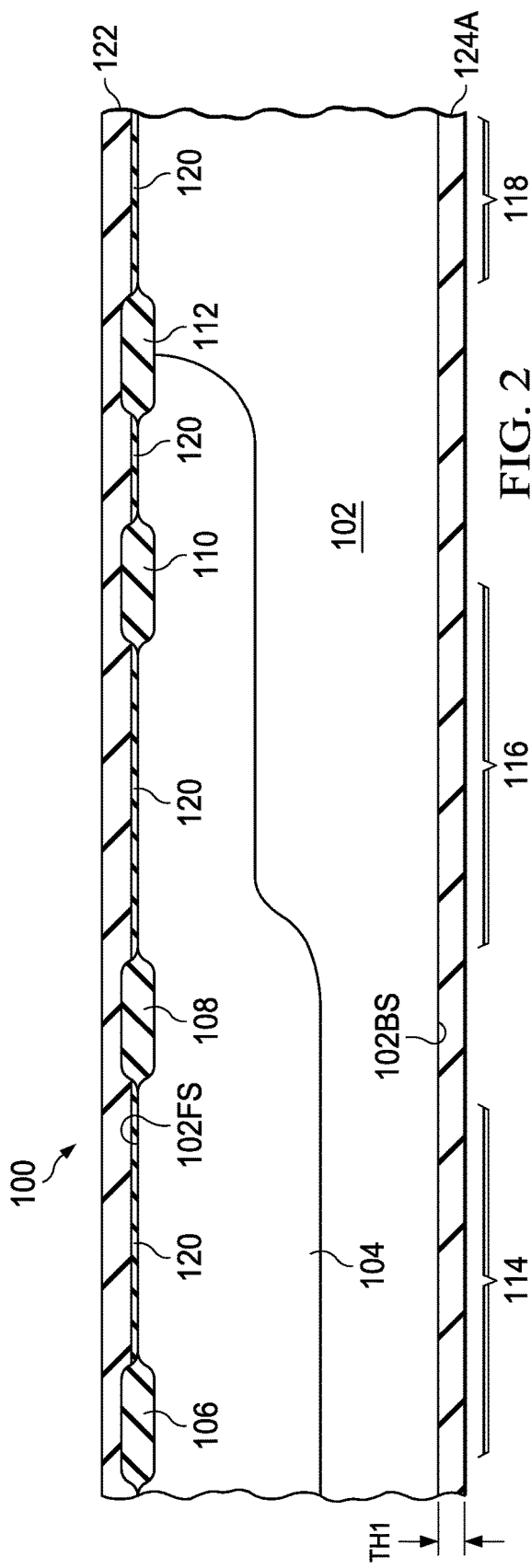

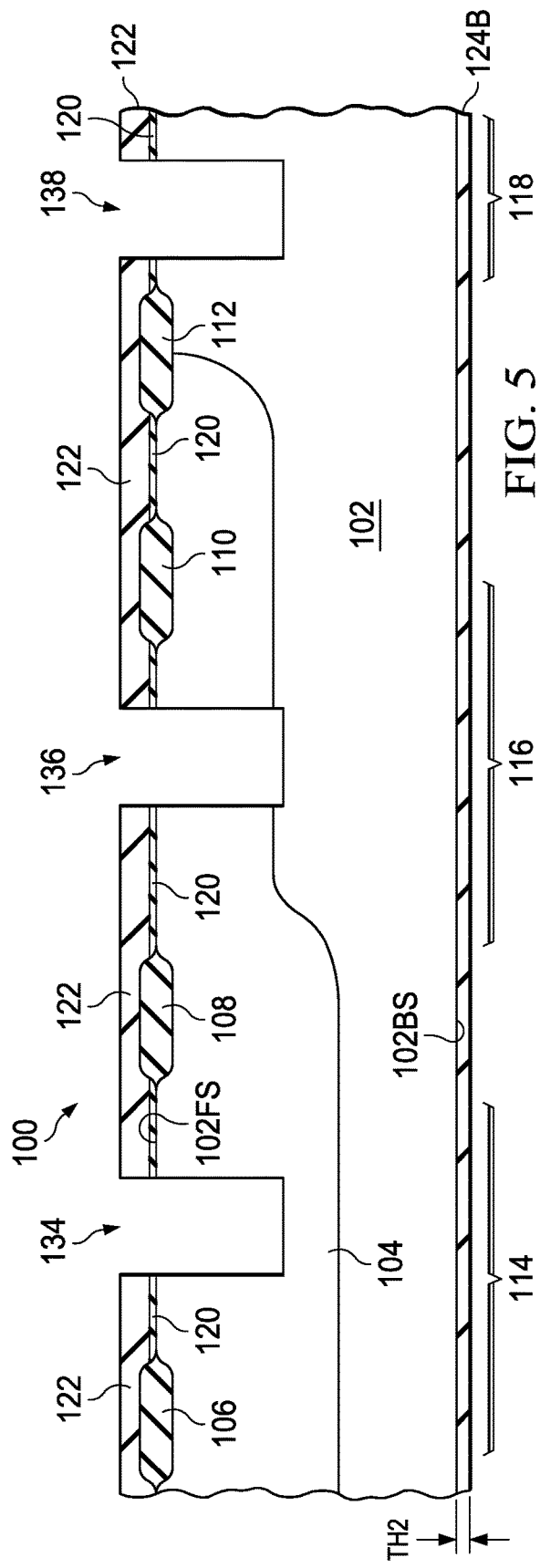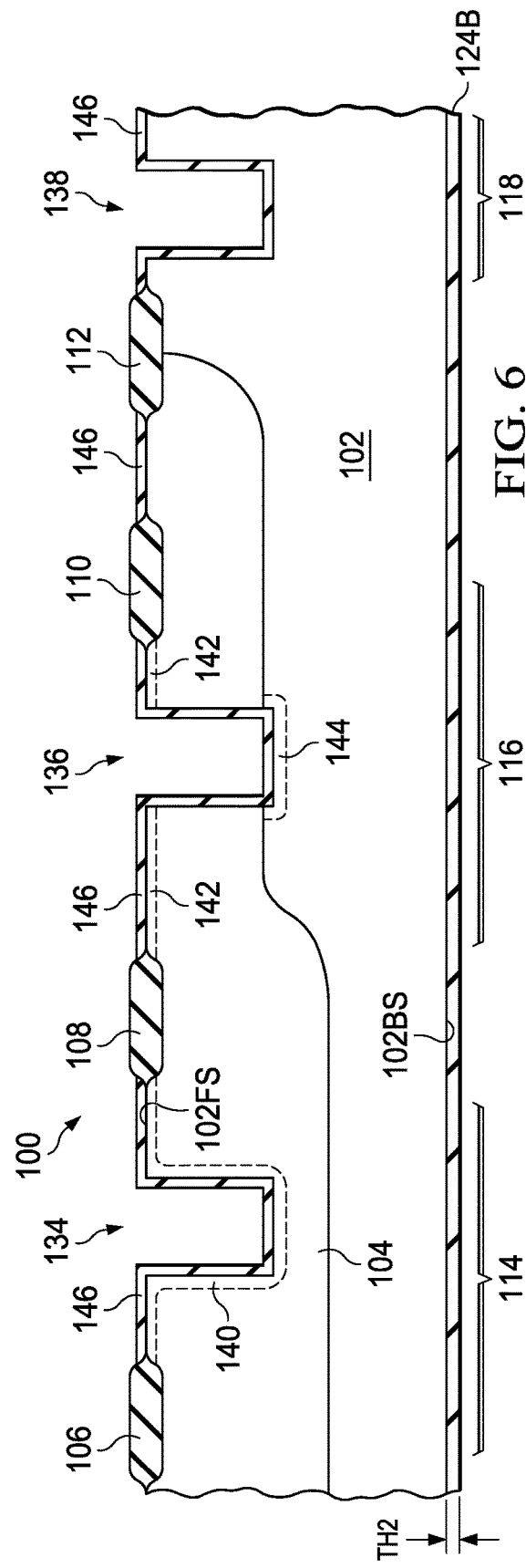

REDUCED SEMICONDUCTOR WAFER BOW AND WARPAGE

CROSS-REFERENCE TO RELATED APPLICATION

Not applicable.

BACKGROUND

The example embodiments relate to semiconductor integrated circuit (IC) fabrication, and more particularly to IC semiconductor wafers and processing.

ICs pervade all manners of electronic devices, and a fundamental structure in the formation of those ICs is a semiconductor wafer, formed for example of silicon. Such a wafer typically includes multiple locations, and on each location a single IC is created, so that ideally in total the number of wafer locations correspond to a same number of ICs. However, in practice, proper formation of one or more of the wafer-located ICs may fail, as typically revealed by testing, where failure can be in operation or as compared to an expected specification. Alternatively, an entire wafer may fail during processing, thereby corresponding to failure of all wafer ICs. Still further, some IC failure may occur after testing, for example once an IC has been separated from the wafer, packaged, and sold to a customer (and implemented in a field of application). Each of these failures undesirably reduces IC yield and increases IC cost.

Certain IC and wafer failures may occur due to wafer bow or warpage. More specifically, during wafer processing, the wafer is typically moved by and between various structures. Further, during processing the wafer is situated within certain structures, for example within an edge ring or other aligning apparatus, in one or more processing chambers. Wafer alignment precision is an important condition for accurate formation of IC features, particularly as IC critical dimensions continue to reduce in size, as has been continuing for decades. Wafer bow and warpage interfere with the alignment goal and, as a result, can cause localized damage to ICs on the wafer, or inconsistent processing of the ICs, for example in feature size or heat uniformity, which can result in inconsistent device performance from some ICs on the wafer as compared to others.

While the preceding has been experienced in various prior art devices, this document provides examples that may improve on certain of the above concepts, as detailed below.

SUMMARY

A method of forming an integrated circuit comprising: first, concurrently forming a first front end of line (FEOL) layer having a first thickness and a surface contacting or facing a semiconductor substrate frontside and a second FEOL layer, including a same material as the first FEOL layer and having a second thickness and a surface contacting or facing a semiconductor substrate backside; and second, processing the second FEOL layer to reduce the second thickness.

Other aspects are also described and claimed.

BRIEF DESCRIPTION OF THE DRAWINGS

FIGS. 1 through 8 are cross-section views representing successive fabrication stages and resultant structures of a semiconductor structure.

DETAILED DESCRIPTION

Examples are described and illustrated with reference to the attached figures, which may not be drawn to scale. Several aspects are described with reference to example applications for illustration, in which like features correspond to like reference numbers. Numerous specific details, relationships, and methods are set forth to provide an understanding, but the scope is not necessarily limited by the illustrated ordering of acts or events, as some acts may occur in different orders and/or concurrently with other acts or events. Further, not all illustrated acts or events may be required to implement a methodology or structure in accordance with one or more examples.

Figure 7:
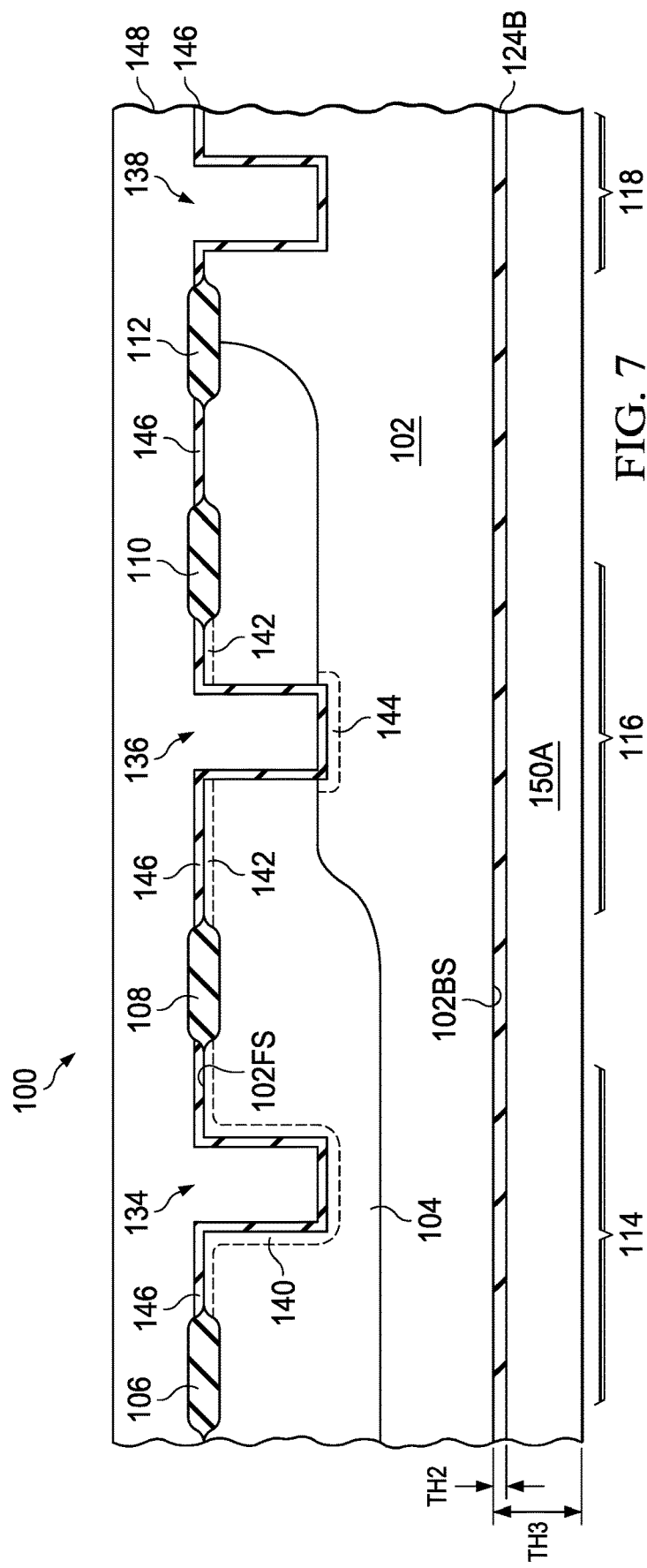
Figure 8:
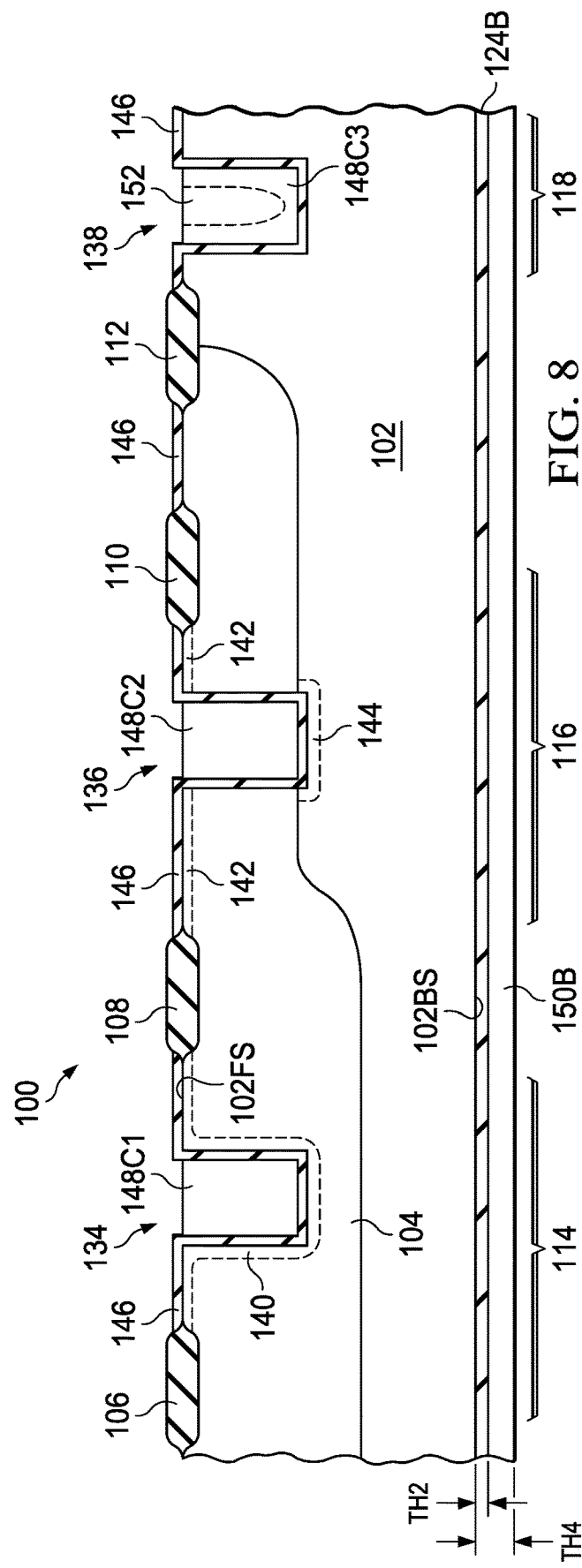
Figure 9:
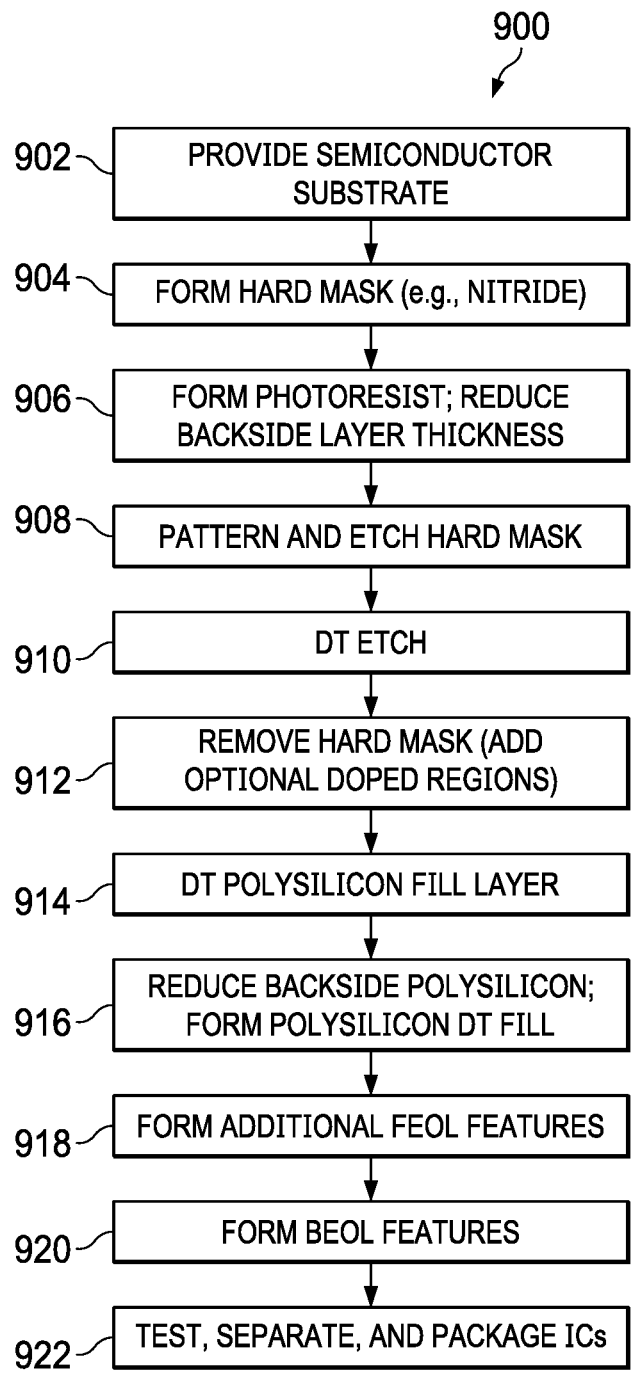
FIG. 9 is a flow diagram of an example method for manufacturing a semiconductor structure, and certain of its steps correspond to respective structures of FIGS. 1 through 8.

FIGS. 1 through 8 are cross-section views representing successive front end of line (FEOL) fabrication stages and resultant structures of a semiconductor structure 100, and FIG. 9 is a method 900, in flow chart form, that summarizes steps of those fabrication stages and also includes, while not illustrated in cross-section view, certain back end of line (BEOL) steps. In FIG. 1 (and FIG. 9 method step 902), a semiconductor structure 100 is provided at an early manufacturing stage. The semiconductor structure 100 includes a semiconductor substrate 102, for example as part of a silicon wafer. Such a wafer typically includes multiple locations, each corresponding to a same or different IC on the wafer, so the illustration of FIG. 1 (and later figures) can be repeated in each wafer IC location. The wafer typically provides either a p-type or n-type semiconductor, and the semiconductor substrate 102 can represent a portion of the bulk wafer or a region (e.g., a well or buried or epitaxial layer) formed in connection with the wafer. In the illustrated example, the semiconductor substrate 102 provides a layer of a first semiconductor type (e.g., an n-type substrate) in which a well 104 (or deep well) of opposite conductivity type (e.g., p-type) is formed. The semiconductor substrate 102 also includes opposing surfaces, referred to in this document as the frontside 102FS and the backside 102BS. For reference, the frontside 102FS is akin to the surface on which, or that supports, most FEOL and BEOL processing and structures, typically constructed in IC fabrication, whereas the backside 102BS is also illustrated and referenced as a predicate for additional example aspects described below.

FIG. 1 also illustrates an example number of dielectric isolation regions 106, 108, 110, and 112. Each of the dielectric isolation regions 106, 108, 110, and 112 may be formed, for example, as local oxidation of silicon (LOCOS) or shallow trench isolation (STI), formed in in a known manner and having a thickness (in the FIG. 1 vertical dimension) of approximately 0.4 µm or less. Each of the dielectric isolation regions 106, 108, 110, and 112 is located, and functions, to electrically isolate regions where devices are to be formed. With respect to such regions, as examples FIG. 1 also illustrates a first region 114, a second region 116, and a third region 118, where later illustration and discussion demonstrate that ultimately each such region will include a deep trench (DT) structure. Each DT structure may have a same or different function or purpose, where various examples are provided later. Lastly, FIG. 1 also illustrates an etch stop layer 120 formed along the frontside 102FS, including between the dielectric isolation regions 106, 108, 110, and 112. The etch stop layer 120 may be formed, for example, as a pad oxide having a thickness in a range from 70 Å to 300 Å in connection with a LOCOS process. Further, forming the etch stop layer 120 may precede the formation of the dielectric isolation regions 106, 108, 110, and 112, or alternatively the etch stop layer 120 may be a grown oxidization layer either before or after the dielectric isolation regions 106, 108, 110, and 112 are formed.

In FIG. 2 (and FIG. 9 method step 904), a hard mask 122 is formed above the dielectric isolation regions 106, 108, 110, and 112 and the etch stop layer 120. In an example, the hard mask 122 is formed by growing a layer of silicon nitride or silicon oxynitride, or a stack using both materials, for example first a silicon nitride layer and second a silicon oxynitride layer, along the above-described structures. As detailed below, the hard mask 122 is subsequently patterned and etched in connection with DT formation. In the illustrated example, however, the formation of silicon nitride or silicon oxynitride along oxide structures also forms silicon nitride or silicon oxynitride along exposed silicon and, accordingly, concurrently with the hard mask 122 a first ancillary layer 124A, of the same material as hard mask 122, also forms along the backside 102BS. In an example, each of the hard mask 122 and the first ancillary layer 124A has a thickness TH1 in a range from 500 Å to 3,000 Å. Further, if the hard mask 122 includes plural layers, for example using the above-described silicon nitride followed by silicon oxynitride, then the silicon oxynitride may add an additional thickness in a range of 20 Å to 200 Å.

Figure 3:
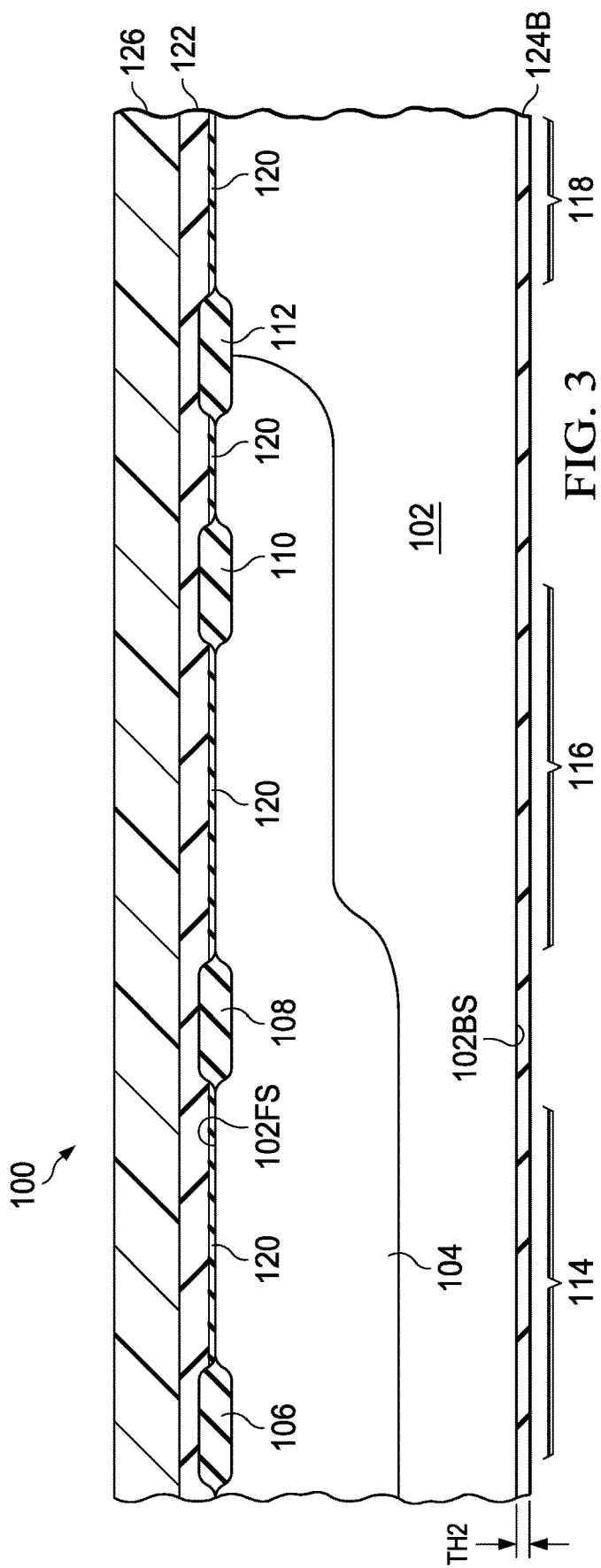

In FIG. 3 (and FIG. 9 method step 906), a photoresist layer 126 is formed above the hard mask 122. For example, the photoresist layer 126 may be formed by spinning photoresist material toward the frontside 102FS, thereby uniformly covering the hard mask 122. Additionally, either before or after forming the photoresist layer 126, the thickness of the FIG. 2 first ancillary layer 124A is reduced, so that in FIG. 3 that layer is shown as an ancillary layer 124B having a thickness TH2, where TH2<TH1 (of FIG. 2). The amount of layer thickness reduction may be to completely remove the first ancillary layer 124A, such that TH2=0, or alternatively as FIG. 3 illustrates, the first ancillary layer 124A may be only partially reduced and some of it may remain on the backside 102BS, so TH1>TH2>0, as shown as the ancillary layer 124B in FIG. 3. In all events, in the illustrated and other examples, the thickness of the backside 102BS layering, corresponding to the thickness of the same DT masking material on the frontside 102FS, is reduced, thereby potentially reducing the effect, such as tensile contribution, of the backside 102BS layering and its potential impact on wafer bowing/warpage. The particular amount of thickness reduction may depend on various factors, for example, based on integration and equipment capability, as well as designer choice, and the layer can be completely removed so as to remove any effect of that layer, or a partial thickness can be left to remain, so as to have a targeted effect, for example to permit an additional force that may still impact wafer bow in a desired or acceptable manner. Further, the first ancillary layer 124A layer thickness reduction, or removal, may be achieved, for example, by wet strip methods, such as hot phosphoric acid, a mixture of hydrogen fluoride (hydrofluoric acid) and hot phosphoric acid, etc. Also, depending on the tool type used to reduce (or remove) the FIG. 2 first ancillary layer 124A, one alternative is to protect the substrate frontside 102FS, and its hard mask 122 from reduction, while at the same time reducing the thickness of the first ancillary layer 124A, for example using a sacrificial silicon oxide or integration friendly film having a surface facing the frontside 102FS, while the backside 102BS layer strip takes place. Additional considerations for determining TH2 are also described later.

Figure 4:
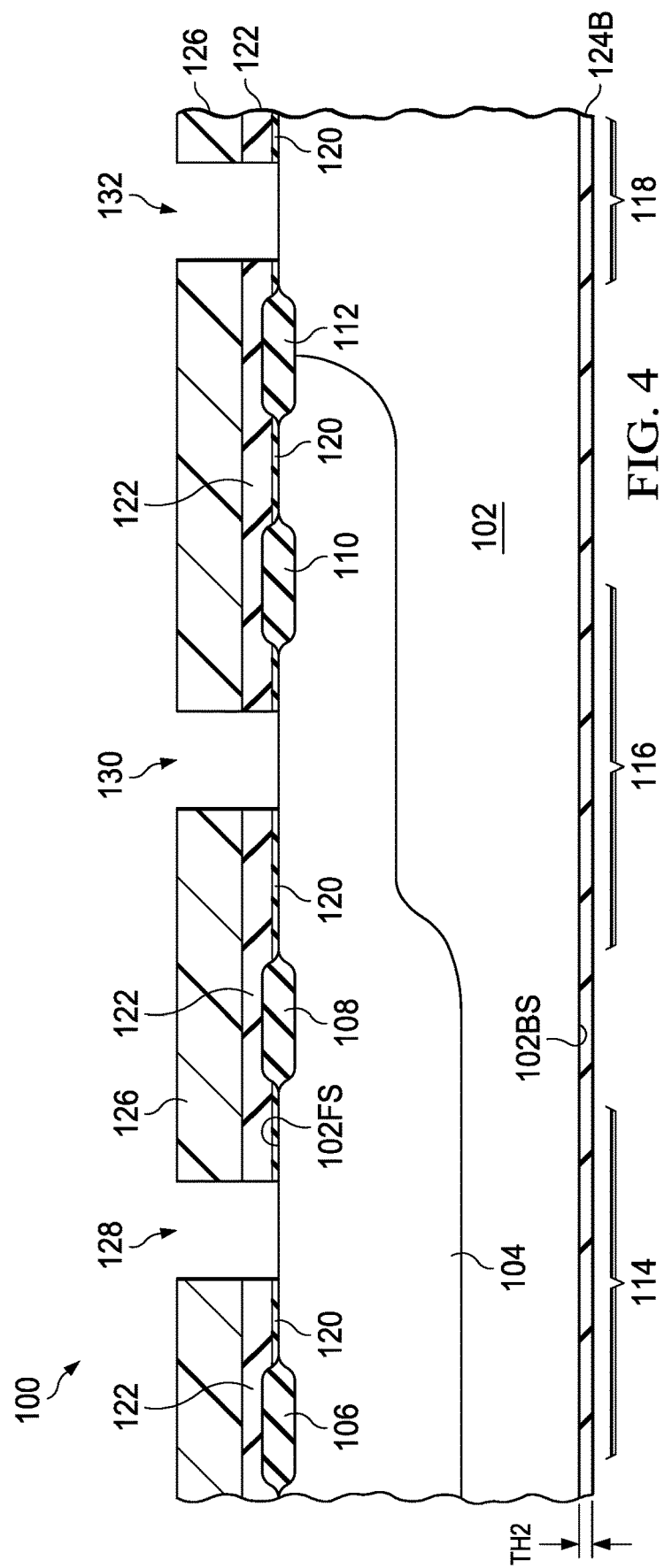

In FIG. 4 (and FIG. 9 method step 908), the photoresist layer 126 is patterned and etched, for example using known photolithography processes. For example, selected areas 128, 130, and 132 of the photoresist layer 126 are exposed to light, by passing such light through a reticle (not shown) and whereby those selected areas 128, 130, and 132 react with the light, for example by becoming more soluble; thereafter, the now more soluble portions are etched (removed), for example with a solvent, thereby exposing corresponding portions of the hard mask 122. With this solvent or additional chemical processing, the etch also removes corresponding exposed areas of the hard mask 122 and the pad oxide 120 in the selected areas 128, 130, and 132.

In FIG. 5 (and FIG. 9 method step 910), the FIG. 4 remaining portions of the photoresist layer 126 are removed, and then a substrate etch is performed, using the hard mask 122 and the FIG. 4 selected areas 128, 130, and 132 through it. The FIG. 5 etch passes through the hard mask 122 and extends into the substrate 102, forming a respective DT 134, 136, and 138. In an example, each DT has a depth greater than 0.5 μm, and can be much deeper, for example of 20 μm to 30 μm, or in alternative examples deeper than 30 μm and up to 150 μm, where depth is measured from the front side 102FS to the bottom of the DT. Accordingly, the depth to the bottom of the DT 134 extends into the well 104, the DT 136 passes through the well 104 and its depth to bottom extends into the substrate 102, and the DT 138 passes into and its depth to bottom is also in the substrate 102.

In FIG. 6 (and FIG. 9 method step 912), the FIG. 5 hard mask 122 is removed, for example using a dry or wet etch that includes a form of phosphoric acid. While not shown, a separate step, for example a soft etch, may be used to reduce roughness on the DT sidewalls and to round the lower DT corners, all to reduce potential electric field discontinuities that may occur due to such attributes. Also, optionally a sacrificial oxide (not shown) may be formed along the exposed surfaces, including within the DTs 134, 136, and 138 (along sidewalls and bottom), followed by selective dopant implants to form other circuit feature regions. In this regard, FIG. 6 illustrates a bottom plate doped region 140 (e.g., high concentration p-type) that is formed through the DT 134 and in the first region 114, source doped regions 142 (e.g., high concentration n-type) that are formed through the frontside 102FS and adjacent the DT 136 and in the second region 116, and a drain doped region 144 (e.g., high concentration n-type) that is formed below the bottom of the DT 136 and also in the second region 116. After these various feature regions are formed, the sacrificial oxide is removed, and a high-quality trench dielectric layer 146 is formed (e.g., grown then annealed) along exposed silicon, so the high-quality trench dielectric layer 146 extends within each of the DTs 134, 136, and 138, and along exposed portions of the front side 102FS.

In FIG. 7 (and FIG. 9 method step 914), a DT fill layer, for example a polysilicon layer 148, is formed above the FIG. 6 structure, thereby contacting the dielectric isolation regions 106, 108, 110, and 112, the trench dielectric layer 146, and filling each of the DT 134, 136, and 138. In an example, the polysilicon layer 148 may be formed by depositing silicon using a traditional furnace process at 620 C°, using gases such as silane, $N_2$, and so forth. During the deposition, the film is doped in situ using $BCl_3$ gas (boron is the dopant), and the resultant layer thickness is in a range between 1.0 and 3.0 μm. Further, the polysilicon deposition may be a single step or multi-step deposition. In multi-step deposition, a thin layer of doped polysilicon is deposited (grown) with a thickness in a range between 0.1 μm and 0.3 μm, followed by thick undoped polysilicon, with a total thickness of in a range between 1.0 and 3.0 μm. As detailed below, the polysilicon layer 148 is selectively reduced or removed in connection with DT conductor formation. In the illustrated example, however, the formation of the polysilicon layer 148 facing the front side 102FS also concurrently forms a second ancillary layer 150A, of the same material as the polysilicon layer 148, along the backside 102BS. In an example, the second ancillary layer 150A has a thickness TH3 in the same ranges as the polysilicon layer 148.

In FIG. 8 (and FIG. 9 method step 916), the FIG. 7 polysilicon layer 148 is processed to remove portions of it, leaving behind and thereby forming DT conductors 148C1, 148C2, and 148C3. The DT conductors 148C1, 148C2, and 148C3 may be formed, for example, by a plasma etch or chemical mechanical polish (CMP) of the FIG. 7 polysilicon layer 148. Still further, with respect to the DT conductor 148C3, an additional implanted region 152, for example of opposite conductive type of the DT conductor 148C3, may be formed within the DT conductor 148C3, so as to enhance an isolation capability of the DT 138. Additional details regarding DT conductors of this isolation structure and functionality may be found in co-owned U.S. Pat. No. 10,811,543, issued Oct. 20, 2020, which is fully incorporated herein by reference. Additionally, preferably before, or also possibly after, forming the DT conductors 148C1, 148C2, and 148C3, the thickness of the FIG. 7 second ancillary layer 150A is reduced, so that in FIG. 8 that layer is shown as an ancillary layer 150B having a thickness TH4, where 0≤TH4<TH3 (of FIG. 7). Accordingly, once again the thickness of the backside 102BS layering, here corresponding to the thickness of the same polysilicon material (the polysilicon layer 148) facing the frontside 102FS, is reduced, thereby adjusting the potential impact that the backside layering otherwise may have on wafer bowing/warpage.

Following the completion of the FIG. 8 structure, and while not shown in corresponding cross-section view, additional FEOL processes and resultant features may be implemented as also shown in FIG. 9 method step 918, where portions of such processes and features may have been realized earlier in the method 900, thereby providing further functionality with respect to each of the regions 114, 116, and 118. Further, such portions are formed into each respective IC on the semiconductor wafer that includes the semiconductor substrate 102. Moreover, in connection with such features, additional layers may be formed in a position contacting or otherwise having a surface facing the frontside 102FS, and for some of those layers, as in the prior-described steps 904 (for the hard mask 122) and 914 (for the polysilicon layer 148), a correspondingly same-material layer may be formed in a position contacting or otherwise having a surface facing the backside 102BS, where such layers also may include nitride, polysilicon, or possibly other materials. For example, a LOCOS loop may implement a nitride layer, as may an offset layer or a sidewall spacer layer. As another example, sidewall or line edge roughness may be improved using polysilicon layer structures for spacing, as shown in co-owned U.S. patent application Ser. No. 17/514,786, entitled "INTEGRATED CIRCUIT DEVICE WITH IMPROVED OXIDE EDGING", filed Oct. 29, 2021, and fully incorporated herein by reference. In these and other possible occurrences, a layer thickness reduction/removal, comparable in some respects to either step 906 or 916, may be performed for each additional layer on or facing the backside 102BS, so as to control the amount of layer, if any, that remains on the backside 102BS following the formation of that layer, where in certain examples the reduction is performed before the frontside 102FS, counterpart same-material layer is removed. Also in connection with step 918, other aspects may be formed, for example without affecting the backside 102BS.

Next, in a step 920, and again while not illustrated in corresponding cross-section view, BEOL processes and resultant features may be implemented. Generally, BEOL is considered to begin with semiconductor fabrication steps and structure where metalization or metal contact is made. For instance, in the first region 114, additional electrical contact can be made to the DT 148C1 as a first capacitor plate, and to the well 104 as a second capacitor plate (with the optional bottom plate doped region 140 enhancing the latter connection), including possibly siliciding an upper area and extending metal structure vertically to a higher layer. As another example, in the second region 116, additional electrical contact can be made to the DT 148C2, as a transistor gate of a vertical transistor, with additional contact and channel conductivity in the p-type well 104, and between the n-type source doped regions 142 and the substrate 102 (with the optional drain doped region 144 enhancing the latter connection). Additional details regarding such processes, structures, and functions, may be found in co-owned U.S. Pat. No. 9,825,030, issued Nov. 21, 2017, which is fully incorporated herein by reference. As a final example, additional contact electrical contact may be made in the third region 118, to either or both of the DT 148C3 and the additional implanted region 152, whereby those structures can provide enhanced device isolation, either alone or as a portion of a region that encircles (not fully shown) other devices. Additional details regarding such processes, structures, and functions, may be found in the above-referenced and incorporated U.S. Pat. No. 10,811,543.

Next, in a step 922, the semiconductor wafer including the semiconductor substrate 102 may be coupled to test equipment and tested, after which each IC is cut (diced) from the semiconductor wafer. Thereafter, some or all of the ICs (e.g., those passing testing) are packaged. Packaging typically places a casing around (or encapsulating) the IC and further provides an external interface, typically a number of conductive pins, fixed relative to pads on the die, and conductors such as wire bonds, lands, or balls, are formed between the IC pads and the packaging pins. Thereafter, any packaged IC with an acceptable test result is ready for sale and shipping to a customer.

From the above, one skilled in the art should appreciate that examples provide for semiconductor IC fabrication, for example with respect to an IC that includes reduced semiconductor wafer bow and warpage. Such embodiments provide various benefits, some of which are described above and including still others. For example, a semiconductor structure 100 is constructed in connection with a semiconductor substrate 102. The semiconductor structure 100 may include one or more DT structures, as may be used as portions of functional electrical circuit features or for isolation. In an example fabrication method, the DT structure(s) are formed using a mask, including nitride, such as in silicon nitride or silicon oxynitride, on the semiconductor substrate frontside 102FS. Further, the existence of the DT, particularly when there are multiple DTs across the semiconductor substrate 102, can cause the wafer that includes that substrate to bow or warp, which can create undesirable effects, such as mis-alignment, inconsistent performance among different ICs from the same wafer, reduced yield, and so forth. In an example, such effect(s) may occur when the total area of the frontside 102FS that is occupied by DT structure(s), that is, the area that is unmasked during the FIG. 5 DT etch (and FIG. 9 method step 910), is equal to or greater than 0.1% of the total frontside 102FS area, and the effect can be even more pronounced when that DT unmasked area is equal to or greater than 0.5% of the total frontside 102FS area. Further, when the DT structure(s) mask is formed on the frontside 102FS, a corresponding layer is also formed on, or has a surface facing, the semiconductor substrate backside 102BS, and that backside layer, for example due to its tensile nature, can further contribute to the wafer bowing/warpage. Accordingly, in the illustrated and other examples, the backside 102BS layering, corresponding to same DT masking material facing the frontside 102FS, is reduced, either partially or fully removing the backside material. The amount of reduction may be selected to target a certain resultant tensile effect across the wafer, where the resultant tensile effect may correspond to a desired wafer bow. The actual amount of removed material thickness, and the targeted resultant tensile effect, may be determined, for example, through experimentation for a given process recipe and device. Additionally, certain of the preceding aspects may be implemented in connection with other FEOL layers, for example in connection with LOCOS layers, or with polysilicon used for DT fill or independent from DT, for example used for alignment, and still others. Still additional modifications are possible in the described embodiments, and other embodiments are possible, within the scope of the following claims.

What is claimed is:

1. A method of forming an integrated circuit, comprising:
concurrently forming a first front end of line (FEOL) layer at a frontside of a semiconductor substrate and a second FEOL layer at a backside of the semiconductor substrate opposite the frontside, wherein the first and second FEOL layers include a same material, and wherein the second FEOL layer has a first thickness; and
removing at least a portion of the second FEOL layer such that the second FEOL layer has a second thickness less than the first thickness as a result of removing at least the portion of the second FEOL layer.

2. The method of claim 1, wherein the first FEOL layer includes a nitride layer.

3. The method of claim 2, further including:
forming a first nitride layer mask by patterning and etching the first FEOL layer; and
etching a deep trench through the first nitride layer mask.

4. The method of claim 3, wherein the deep trench has a depth between 0.4 µm and 150 µm.

5. The method of claim 3, wherein the deep trench has a depth between 20 µm and 150 µm.

6. The method of claim 3, wherein:
the semiconductor substrate is a portion of a semiconductor wafer; and
the deep trench is a first deep trench in a plurality of deep trenches formed in at least 0.1% or greater of a frontside of the semiconductor wafer.

7. The method of claim 3, further including:
forming a polysilicon material within the deep trench.

8. The method of claim 7, wherein forming the polysilicon material within the deep trench concurrently forms a backside polysilicon layer at the backside of the semiconductor substrate, the backside polysilicon layer having a third thickness, and wherein the method further includes removing at least a portion of the backside polysilicon layer such that the backside polysilicon layer has a fourth thickness less than the third thickness as a result of removing at least the portion of the backside polysilicon layer.

9. The method of claim 8, wherein removing at least the portion of the backside polysilicon layer includes completely removing the backside polysilicon layer.

10. The method of claim 8, wherein the backside the fourth thickness is greater than zero.

11. The method of claim 1, wherein removing at least the portion of the second FEOL layer includes completely removing the second FEOL layer.

12. The method of claim 1, wherein the second thickness is greater than zero.

13. The method of claim 1, wherein the first FEOL layer includes a silicon nitride layer, a silicon oxynitride layer, or both.

14. The method of claim 1, wherein the forming a first FEOL layer includes forming the first FEOL layer as part of a LOCOS loop.

15. The method of claim 1, wherein the forming a first FEOL layer includes forming the first FEOL layer as part of an offset layer.

16. The method of claim 1, wherein the forming a first FEOL layer includes forming the first FEOL layer as part of a sidewall spacer layer.

17. The method of claim 1, wherein the first FEOL layer includes a polysilicon layer.

* * * * *